US007127550B1

United States Patent
Lin (10) Patent No.: US 7,127,550 B1
(45) Date of Patent: Oct. 24, 2006

(54) MULTI-MODULE SIMULTANEOUS PROGRAM, ERASE TEST, AND PERFORMANCE METHOD FOR FLASH MEMORY

(75) Inventor: Jason T. Lin, Santa Clara, CA (US)

(73) Assignee: SanDisk Corporation, Milpitas, CA (US)

( * ) Notice: Subject to any disclaimer, the term of this patent is extended or adjusted under 35 U.S.C. 154(b) by 583 days.

(21) Appl. No.: 10/000,828

(22) Filed: Oct. 31, 2001

(51) Int. Cl.
*G06F 13/00* (2006.01)

(52) U.S. Cl. .................. 711/103; 714/72; 714/718; 714/719; 365/104; 365/185.29; 365/185.3

(58) Field of Classification Search ............... 711/103; 714/718, 719, 72; 365/104, 185.29, 185.3, 365/185

See application file for complete search history.

(56) References Cited

U.S. PATENT DOCUMENTS

| | | | | |
|---|---|---|---|---|
| 5,379,401 A | * | 1/1995 | Robinson et al. | 711/103 |
| 5,428,566 A | | 6/1995 | Robinson | 365/63 |
| 5,430,859 A | | 7/1995 | Norman et al. | 395/425 |
| 5,623,214 A | * | 4/1997 | Pasiecznik, Jr. | 324/754 |
| 5,663,901 A | | 9/1997 | Wallace et al. | 365/52 |
| 5,675,546 A | * | 10/1997 | Leung | 365/201 |
| 5,760,643 A | * | 6/1998 | Whetsel | 327/565 |
| 5,848,026 A | * | 12/1998 | Ramamurthy et al. | 365/238.5 |
| 5,867,507 A | | 2/1999 | Beebe et al. | 371/22.31 |
| 6,072,719 A | * | 6/2000 | Tanzawa et al. | 365/185.03 |
| 6,128,219 A | | 10/2000 | Pio et al. | 365/185.09 |
| 6,226,766 B1 | * | 5/2001 | Harward | 714/719 |
| 6,233,184 B1 | * | 5/2001 | Barth et al. | 365/201 |
| 6,243,839 B1 | | 6/2001 | Roohparvar | 714/718 |
| 6,272,655 B1 | | 8/2001 | Hecht et al. | 714/725 |
| 6,282,145 B1 | | 8/2001 | Tran et al. | 365/230.06 |
| 6,546,505 B1 | * | 4/2003 | Swoboda et al. | 714/30 |
| 6,549,469 B1 | | 4/2003 | Gochi | 365/189.01 |
| 6,643,725 B1 | * | 11/2003 | Kozakai et al. | 710/300 |
| 6,649,931 B1 | * | 11/2003 | Honma et al. | 257/48 |
| 2002/0116668 A1 | * | 8/2002 | Chhor et al. | 714/42 |

FOREIGN PATENT DOCUMENTS

GB    0 681 295 A1  *  5/1994

\* cited by examiner

*Primary Examiner*—Reba I. Elmore
(74) *Attorney, Agent, or Firm*—Parsons Hsue & de Runtz LLP (57) ABSTRACT

Methods and apparatus for accessing modules on a flash memory package concurrently during testing are disclosed. According to one aspect of the present invention, a memory device for storing data includes a plurality of modules and a logic block. The plurality of modules each include a plurality of storage elements that hold the data. The logic block is arranged to enable the plurality of modules to be accessed in parallel, and is also arranged to enable the plurality of modules to be accessed serially.

23 Claims, 9 Drawing Sheets

MULTI-MODULE SIMULTANEOUS PROGRAM, ERASE TEST, AND PERFORMANCE METHOD FOR FLASH MEMORY

BACKGROUND OF THE INVENTION

1. Field of Invention

The present invention relates generally to mass digital data storage systems. More particularly, the present invention relates to systems and methods for efficiently testing flash memory systems.

2. Description of the Related Art

The use of non-volatile memory systems such as flash memory storage systems is increasing due to the compact physical size of such memory systems, and the ability for non-volatile memory to be repetitively reprogrammed. The compact physical size of flash memory storage systems facilitates the use of such storage systems in devices which are becoming increasingly prevalent. Devices which use flash memory storage systems include, but are not limited to, digital cameras, digital camcorders, digital music players, handheld personal computers, and global positioning devices. The ability to repetitively reprogram non-volatile memory included in flash memory storage systems enables flash memory storage systems to be used and reused.

Figure 1:
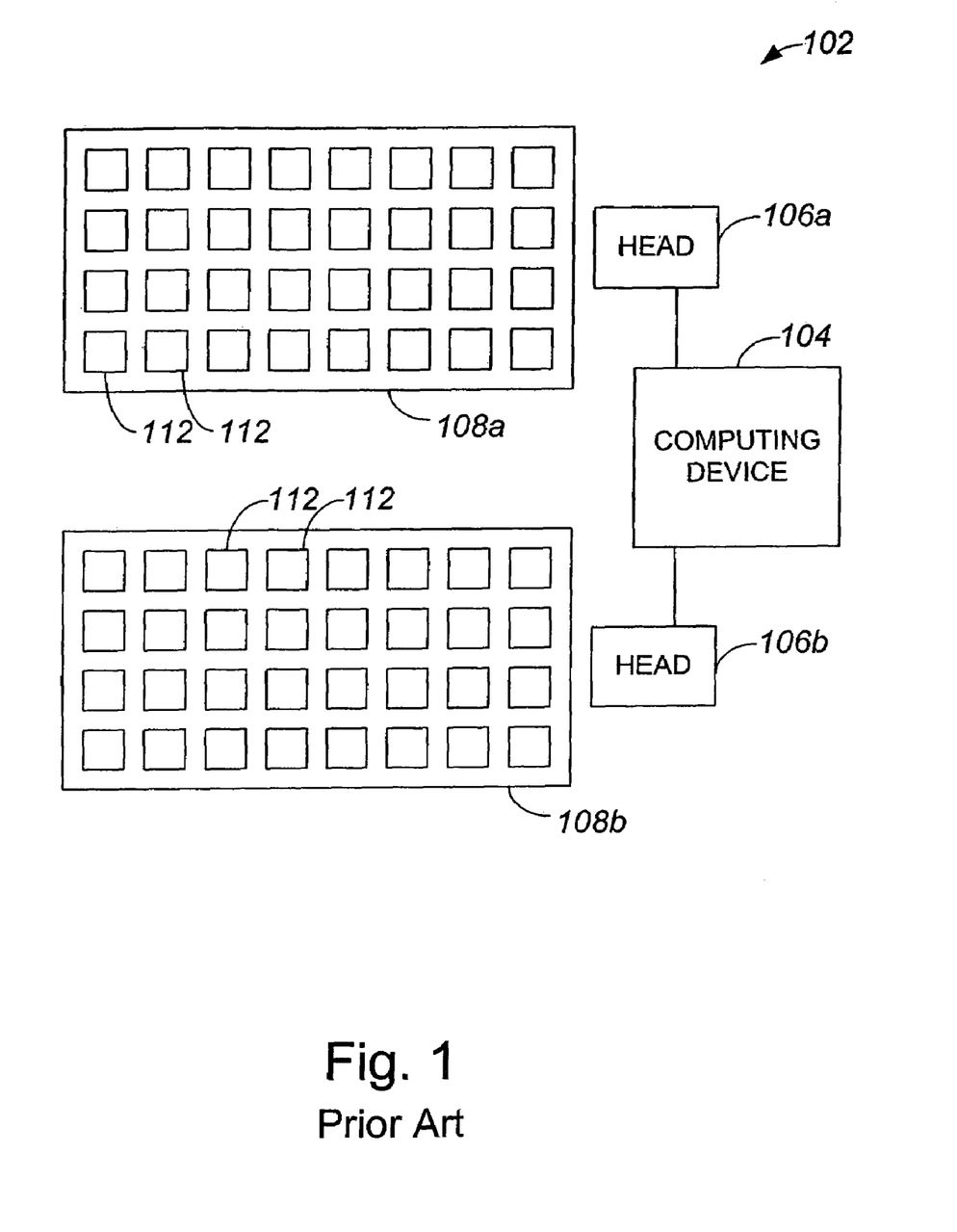
FIG. 1 is a diagrammatic representation of a test system which is suitable for testing flash memory packages.

The reliability of a flash memory storage system, or a flash memory package, is important to ensure that information may be reliable stored and retrieved. In order to effectively ensure that a flash memory package is reliable, a flash memory package may be tested as a part of an overall manufacturing process. FIG. 1 is a diagrammatic representation of a testing device which is suitable for testing non-volatile, flash memory packages. A testing device 102 includes a computing device 104 and heads 106. As shown, testing device 102 may include two heads 106 which are each arranged to hold approximately thirty-two packages 112 in an array 108. Each head 106 tests an array 108 of packages 112, i.e., head 106a tests packages 112 associated with array 108a and head 106b tests packages 112 associated with array 108b. Specifically, heads 106 test packages 112 by performing operations on packages 112 at the command of computing device 104.

Figure 2A:
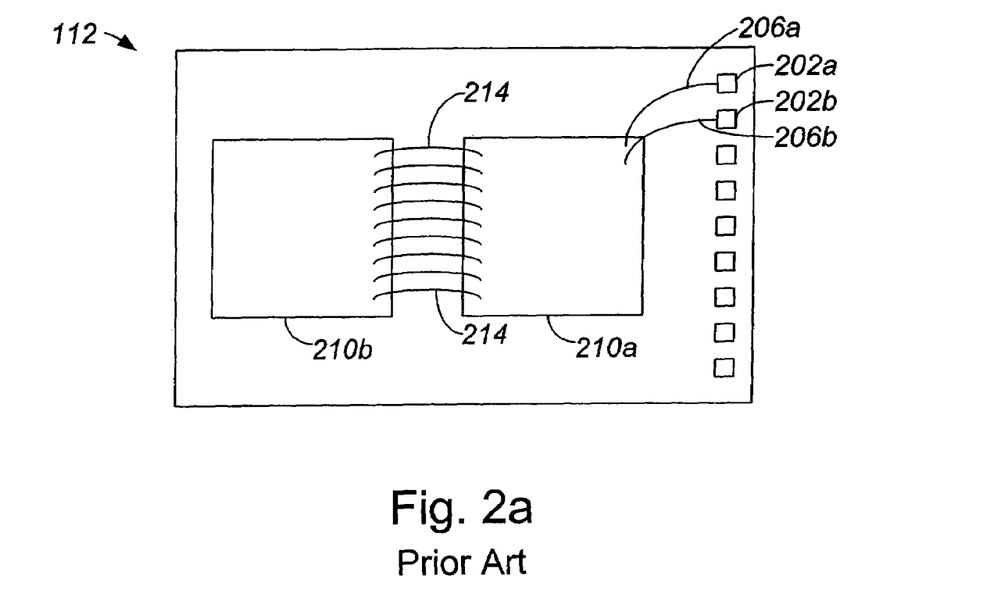
FIG. 2a is a diagrammatic representation of a flash memory package which includes a plurality of dies.

With reference to FIG. 2a, the configuration of one conventional package 112 will be described. As shown, package 112 includes pads 202 and a plurality of dies 210a, 210b which are arranged to receive signals, e.g., test signals, from computing device 104 of FIG. 1. Herein and after, for ease of discussion, dies 210a, 210b will generally be referred to as dies 210. Once test signals are received by pads 202, test signals are processed by a first die 210a. By way of example, if a test signal is a program signal, then memory cells associated with die 210a are programmed. Once a test signal associated with die 210a are processed, the test signal may be sent across connections 214 to a second die 210b, which then processes the test signal. That is, dies 210 are arranged to process signals or, more generally, to be accessed, in a serial manner such that substantially all actions associated with die 210a are completed before the actions are performed with respect to die 201b.

Figure 2B:
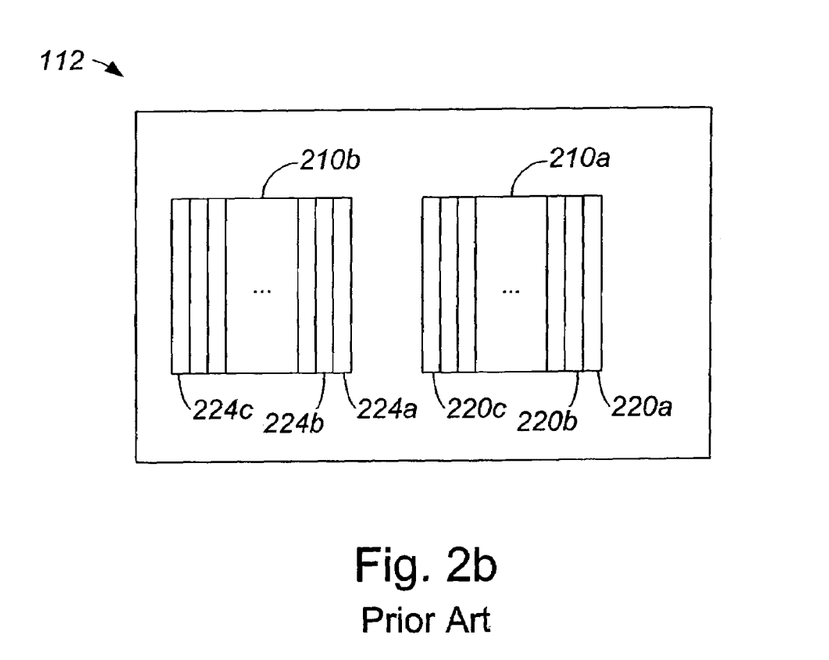
FIG. 2b is a diagrammatic representation of a flash memory package, i.e., flash memory package 112 of FIG. 2a, which shows memory cells associated with a plurality of dies.

As mentioned above, dies 210 include memory cells which are arranged to store data, e.g., data provided in a test signal. FIG. 2b is a diagrammatic representation of package 112 of FIG. 2a which shows memory cells in accordance with an embodiment of the present invention. Each die 210 includes any number of memory cells 220, 224. Memory cells 220, 224 are arranged to store data which may be retrieved or read as needed.

Dies 210 process signals or commands in a serial manner such that when a program instruction, for example, is received, memory cells 220 are programmed before memory cells 224 are programmed. That is, memory cells 224 which are associated with die 210b are not programmed until after memory cells 220 of die 210a are programmed, i.e., dies 210 are programmed serially with memory cells 220 of die 210a being programmed before memory cells 224 of die 210b.

Figure 3:
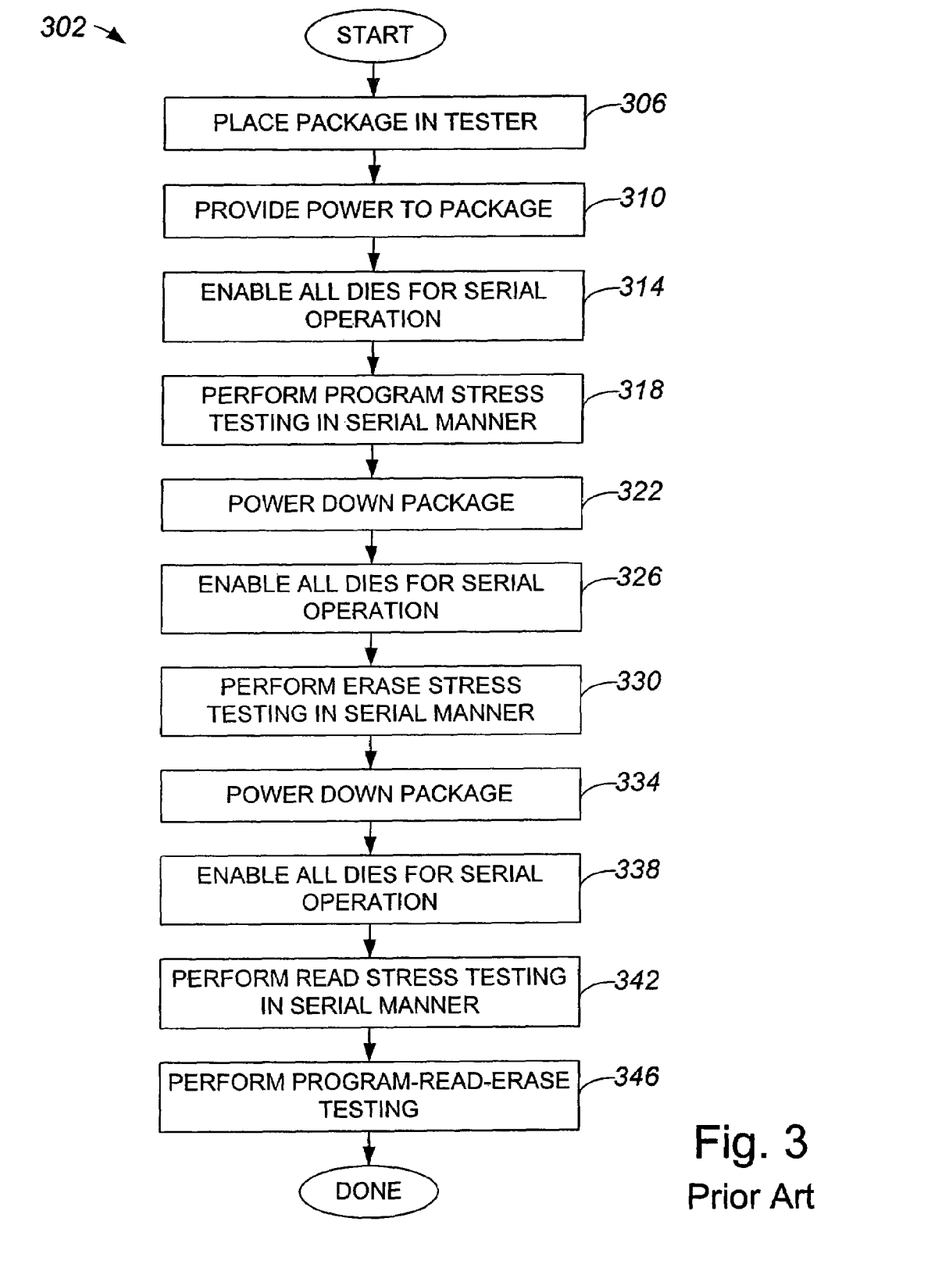
FIG. 3 is a process flow diagram which illustrates the steps associated with a conventional method of testing a flash memory package.

In general, package 112 is tested using a tester such as testing device 102 of FIG. 1. Testing package 112 generally enables a determination to be made regarding whether package 112 is viable or reliable, e.g., whether package 112 is suitable for use by a consumer, as previously mentioned. FIG. 3 is a process flow diagram which illustrates the steps associated with a conventional method of testing a flash memory package with multiple dies. A process 302 begins at step 306 in which a flash memory package is placed in a tester. Typically, a tester includes a mechanical support, test heads, and a computing system, as will be appreciated by those skilled in the art. It should be understood that although a tester such as testing device 102 of FIG. 1 generally tests multiple packages at any given time, for ease of discussion, process 302 is described in terms of testing a single package. Once the package is placed in the tester, power is provided to the package in step 310. That is, the package is powered up.

After the package is powered up, the dies in the package are enabled for serial operation in step 314. Enabling the dies for serial operation typically involves issuing commands using the tester such that memory cells on dies may be tested serially, one die at a time. In step 318, program stress testing is performed in a serial manner. Program stress testing is typically testing that stresses specific parts of transistors associated with the memory cells, and often involves ensuring that the package may survive a ten year life span. Performing such testing in a serial manner generally involves serially testing substantially all memory cells of one die before serially testing substantially all memory cells of another die.

Once program stress testing is completed, the package is powered down in step 322. Upon powering down the package, all dies are enabled for serial operation in step 326, and erase stress testing is performed in a serial manner in step 330. Erase stress testing typically involves stressing transistors used in erase operations. After erase stress testing is performed, the package is powered down in step 334, and the dies are enabled for serial operation in step 338. Then, in step 342, read stress testing, which generally involves stressing transistors used in read operations, is performed in a serial manner. When the read stress testing is completed, substantially all stress testing is considered to be completed. Accordingly, process flow moves to step 346 in which program-read-erase testing is performed. The steps associated with one conventional method of performing program-read-erase testing will be described below with respect to FIGS. 4a and 4b. When program-read-erase testing is completed, the process of testing a flash memory package with multiple dies is effectively completed.

Figure 4A:
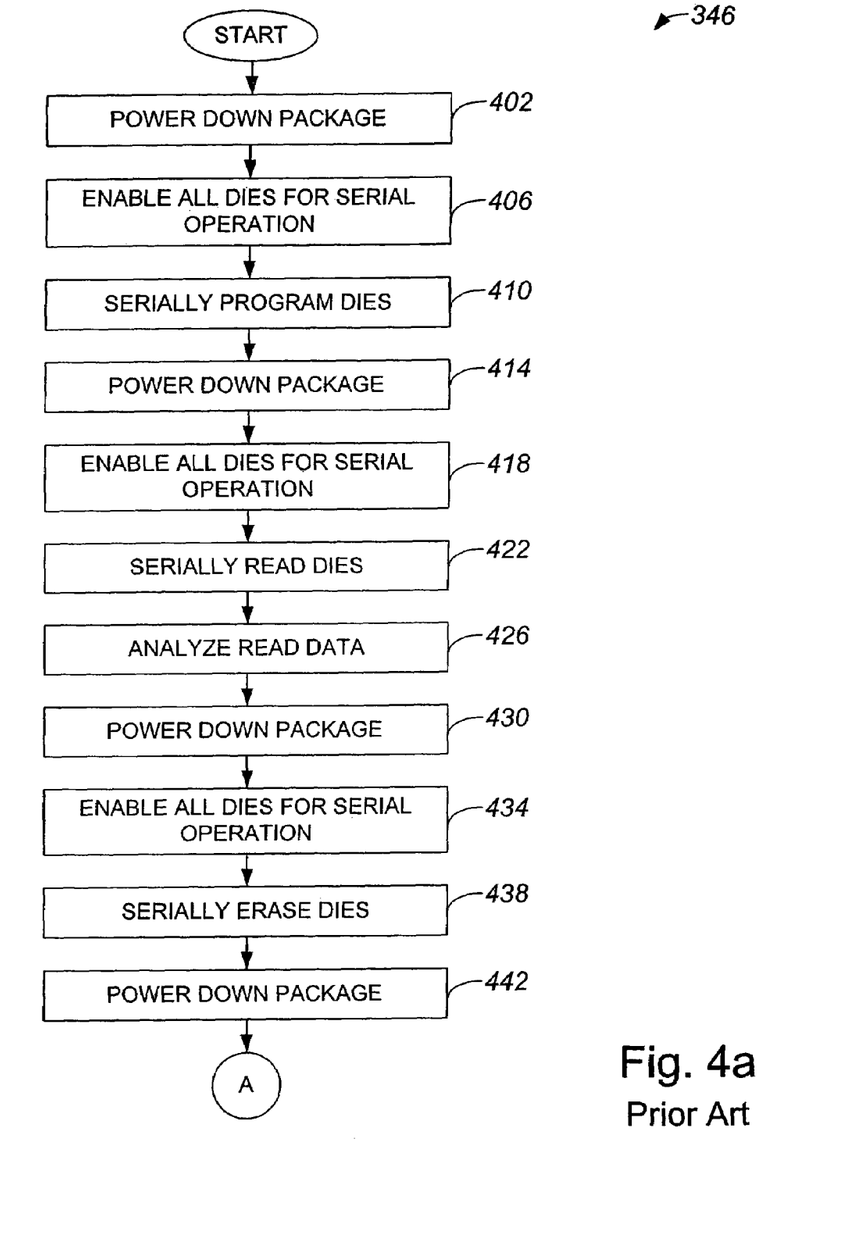
FIGS. 4a and 4b are a process flow diagram which illustrates the steps associated with a conventional method of performing a program-read erase test, i.e., step 346 of FIG. 3.
Figure 4B:
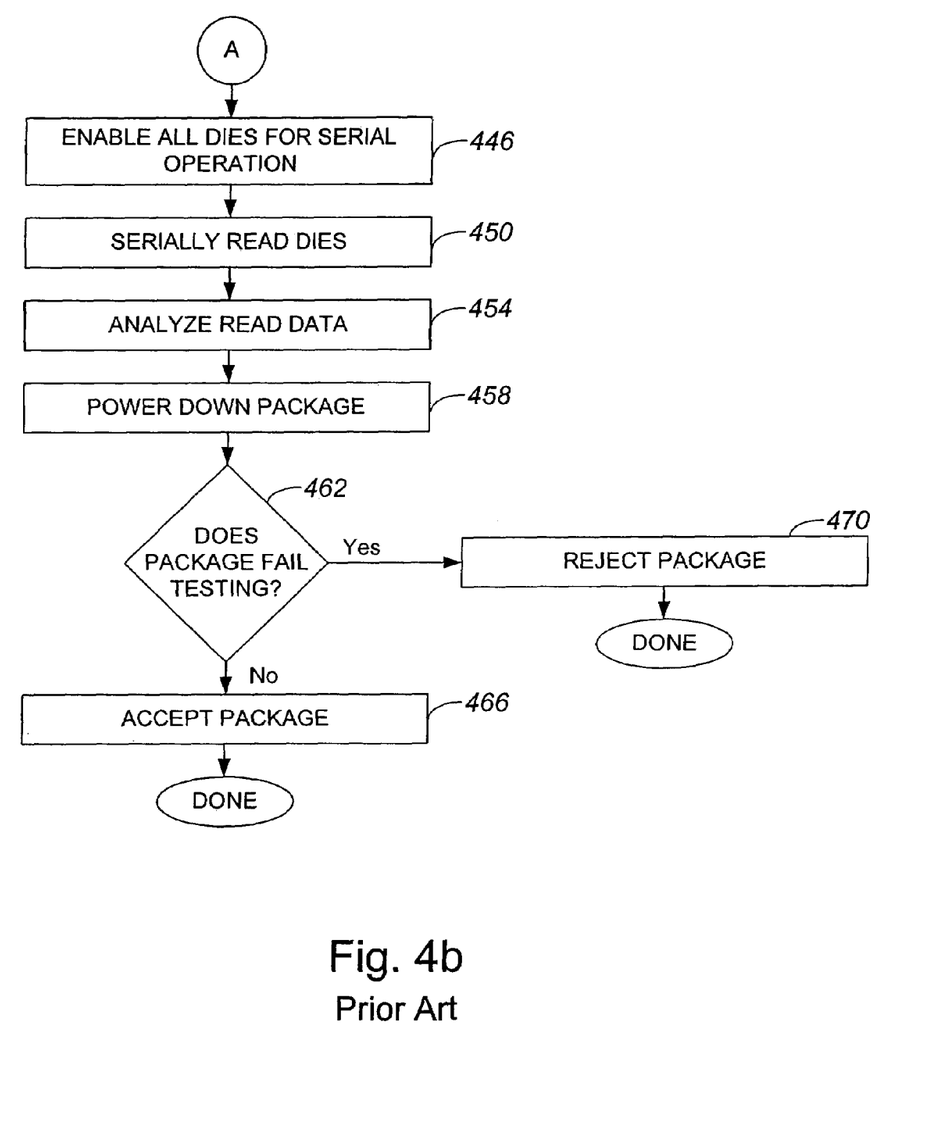

With reference to FIGS. 4a and 4b, the steps associated with one conventional method of performing a program-read-erase test, e.g., step 346 of FIG. 3, on a flash memory package with multiple dies will be described. A process 346 begins at step 402 in which the package is powered down. Once the package is powered down, the dies in the package are enabled for serial operation, i.e., using the tester which is performing the program-read-erase test, in step 406. After the dies are enabled, the dies are serially programmed in step 410. Typically, each memory cell associated with each die is serially programmed to a particular value.

In step 414, the package is once again powered down. Then, in step 418, all dies in the package are enabled for serial operation, and the contents of the dies or, more specifically, the contents of the memory cells associated with the dies, are read serially. The read data is then analyzed in step 426 to ascertain whether the data that has been read was accurately programmed in step 410. That is, the analysis in step 426 may be performed to ascertain whether the data that was programmed in step 410 was stored in the memory cells accurately, or, more generally, if the read data is consistent with what is expected.

Once the read data is analyzed in step 426, the package is powered down in step 430. In step 434, all dies are enabled for serial operations, and the dies are serially erased in step 438. The package is then powered down in step 442. From step 442, process flow proceeds to step 446 in which all dies are enabled for serial operation. After the dies are enabled for serial operation, the contents of the dies are read serially in step 450 such that the memory cells of one die within the package are read serially before the memory cells of another die within the package are read serially. The data that is read from the memory cells is analyzed in step 454, for example, to determine if the memory cells were properly erased in step 438 or, more generally, if the read data is as expected.

The package is powered down in step 458, after the read data is analyzed in step 454. From step 458, process flow proceeds to step 462 in which it is determined if the package failed the program-read-erase test. If it is determined that the package failed testing, then the indication is that at least one memory cell associated with the package either failed to be programmed properly, failed to be read properly, or failed to be erased properly. Hence, the package is rejected in step 470, and the process of performing a program-read-erase test is completed. Alternatively, if it is determined in step 462 that the package did not fail testing, then the package is accepted, e.g., considered to be reliable, in step 466, and the process of performing a program-read-erase test is completed.

The overall process of testing a flash memory package is time-consuming. In particular, program and erase operations account for a significant percentage of the time required to perform an overall testing process. For example, one standard overall testing process performed on a flash memory package may require over three hours, with a substantial percentage of the three hours being associated with programming and erasing memory cells of the package. The amount of time associated with an overall testing process may also be shorter, or much longer, however, depending upon the associated test flow and the density of the flash memory package. A long testing process generally reduces the throughput associated with a tester, e.g., testing device 102 of FIG. 1. That is, the number of flash memory packages which may be testing by a testing device is typically limited by the amount of time required to test the packages. As the cost of testing devices is relatively high, obtaining additional testing devices to increase the number of flash memory packages which may be testing in a given time period is generally not desirable.

Therefore, what is desired is a method for increasing the throughput of a testing device. That is, what is needed is an efficient method for testing flash memory packages.

SUMMARY OF THE INVENTION

The present invention relates to a system and a method for accessing modules on a flash memory package concurrently during testing, and to the design of flash memory automated test equipment (ATE) testers such that the testers increase testing throughput. According to one aspect of the present invention, a memory device for storing data includes a plurality of modules and a logic block. The plurality of modules each include a plurality of storage elements that hold the data. The logic block is arranged to enable the plurality of modules to be accessed in parallel, and is also arranged to enable the plurality of modules to be accessed serially.

In one embodiment, the plurality of modules includes a first module which includes a first storage element and a second module which includes a second storage element. In such an embodiment, the memory device may also include a signal source that is arranged to provide a signal which includes the data to either or both the first storage element and the second storage element. When the logic block enables the plurality of modules to be accessed in parallel, the signal source provides the signal to the first storage element and the second storage element substantially concurrently.

By allowing modules of a package to be accessed substantially in parallel, programming procedures and erasing procedures performed on the modules may occur more efficiently, as the modules may effectively be programmed or erased concurrently.

Hence, the time associated with performing programming and erasing procedures may be reduced. As a result, the time associated with testing a package, which generally involves programming and erasing operations, may be reduced. Reducing testing time typically enables the throughput associated with a testing apparatus to be increased.

According to another aspect of the present invention, a computing system includes a host system and a memory system which are in communications with one another. The memory system includes a plurality of modules that each include at least one storage element that is arranged to hold data. The memory system also includes a state machine that enables the plurality of modules to be accessed in parallel. In one embodiment, the host system is arranged to capture information and to attempt to store the information in the memory system.

According to still another aspect of the present invention, a method for operating a memory system that includes a first module and a second module includes receiving a first command on the memory system. Once the first command is received, the memory system is configured in response to the received first command. When the received first command is a command to enable the first module and the second module to perform actions in parallel, configuring the memory system includes configuring the first module and the second module to perform actions substantially concurrently.

In one embodiment, the first module includes a first storage element and the second module includes a second storage element. When the received first command is the command to enable the first module and the second module to perform actions in parallel, the method also involves receiving a program command on the memory system, and programming the first storage element and the second storage element substantially concurrently in response to the received program command.

According to yet another aspect of the present invention, a memory device for storing data includes a first dies and a second die. The first die including a first storage element, and the second die includes a second storage element. The first die and the second die are arranged to be accessed in parallel such that an instruction issued to the first storage element is issued substantially concurrently to the second storage element. In one embodiment, the first storage element and the second storage element are arranged to be programmed substantially concurrently when the instruction issued is a program instruction to program the first storage element and the second storage element. In another embodiment, the first storage element and the second storage element are arranged to be erased substantially concurrently when the instruction issued is an erase instruction to erase the first storage element and the second storage element.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

Reducing the amount of time associated with testing flash memory package or more generally, non-volatile storage devices, reduces the overhead associated with testing the flash memory packages and generally enables the typically time-consuming process of comprehensively testing flash memory packages to be accomplished more efficiently. By configuring the flash memory packages such that dies within the flash memory packages may be accessed and tested in a parallel manner, multiple dies may be tested substantially simultaneously or concurrently, instead of on a die-by-die basis. Hence, the time associated with testing dies in a flash memory package may be significantly reduced. For instance, program and erase operations that are generally associated with testing procedures may occur more quickly when dies are programmed and erased concurrently.

A reduction of the testing time associated with overall flash memory packages allows the throughput of testing equipment to be increased, as a single piece of test equipment, e.g., a tester with two heads which test approximately thirty two packages per head, may test significantly more packages in a given amount of time by testing the multiple dies within the package substantially simultaneously. In other words, packages may be cycled through a tester more quickly. Hence, testing multiple dies associated with a package substantially simultaneously generally reduces the overhead associated with testing processes. As will be understood by those skilled in the art, test time reductions and performance improvements, e.g., improvements associated with a faster program operation and a faster erase operation, may be further increased by increasing the number of dies or modules within a package which may be accessed in parallel.

In one embodiment, in order to enable multiple dies or modules on a package to be tested substantially simultaneously, the package is provided with the functionality needed to cause the package in parallel. Such functionality may be provided by configuring a logic block, e.g., a state machine, associated with the package to allow the dies in the package to be accessed in parallel. Accessing the dies in parallel may include, but is not limited to, allowing storage elements or cells associated with each die to be accessed substantially simultaneously. It should be appreciated that a state machine or a logic block which has the capability of enabling the dies of a package to be accessed in parallel generally also includes the capability of enabling the dies to be accessed serially, e.g., such that contents of the storage elements associated with one die may substantially all be read before the contents of another die are read.

Figure 5:
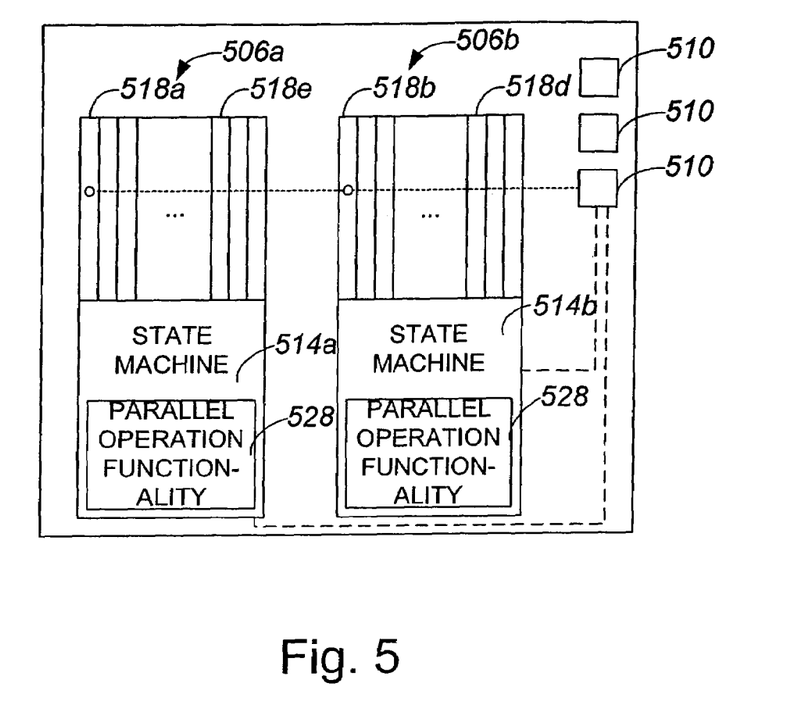
FIG. 5 is a diagrammatic representation of a memory package which includes a plurality of dies that may be enabled in parallel in accordance with an embodiment of the present invention.

With reference to FIG. 5, a flash memory package with a plurality of dies which may be enabled in parallel will be described in accordance with an embodiment of the present invention. A package 502 includes dies 506a, 506b, pads 510, and a state machine 514 that includes logic blocks 514a, 514b. Herein and after, for ease of discussion, dies 506a, 506b will generally be referred to as dies 506. It should be appreciated that package 502 generally includes a variety of other components which, for ease of illustration, have not been shown. Dies 506, or modules, include cells 518 which are arranged to hold or store bits of data. In general, dies 506 may be stacked, e.g., one die may be substantially positioned atop another die, although dies 506 may also be positioned substantially side-by-side. Although the number of dies 506 included in package 502 may vary widely, in the described embodiment, package 502 includes two dies. Pads 510 facilitate the transfer of signals, e.g., test signals from a tester that is in contact with pads 510, to cells 518.

State machine 514, which includes logic blocks 514a, 514b, is generally arranged to control the data processing operations performed within package 502. Such operations may include, but are not limited to, programming operations, reading operations, and erasing operations associated with cells 518, and may store results of status reads performed with respect to dies 506, as will be appreciated by those skilled in the art. In the described embodiment, state machine 514 includes parallel operation functionality 528. That is, state machine 514, which is generally a logic block, is arranged to support the activation of dies 506 in parallel such that when cell 518a of die 506a is being programmed or erased, cell 518b of die 506b may be programmed or erased concurrently. Parallel operation functionality 528 may be achieved by configuring state machine 514 to enable dies 506 to receive signals through pads 510 substantially simultaneously. State machine 514 also includes serial operation functionality, which enables dies 506 to be programmed, read, and erased serially when the serial operation functionality is activated, e.g., enables signals to be received from pads 510 on substantially only one die 506 at a time. A state machine 514, or logic blocks 514a, 514b, may be configured to be able to select each die 506 or module within the overall system individually, and to select all dies 506 or modules substantially simultaneously based on a configuration command to act on subsequent commands such as address inputs and data inputs.

Figure 6:
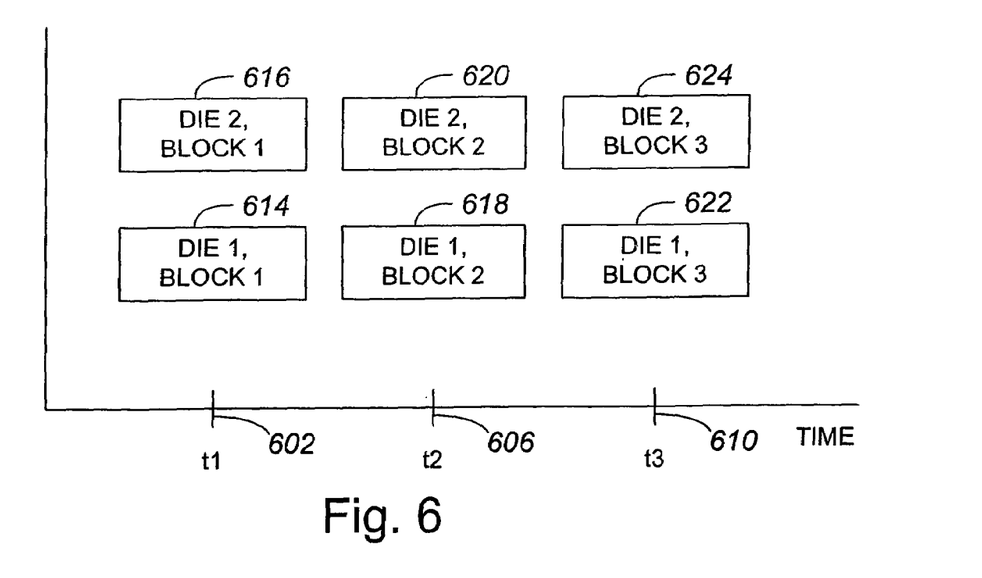
FIG. 6 is a diagrammatic representation of a block access time line in accordance with an embodiment of the present invention.

Since package 502 includes parallel operation functionality 528, dies 506 within package 502 may be tested in parallel, i.e., may be subject to a testing process in which dies 506 are accessed and tested substantially concurrently. FIG. 6 is a diagrammatic representation of a timeline associated with a parallel testing process in accordance with an embodiment of the present invention. At a time t1 602, during a write operation or an erase operation of an overall parallel testing process, a first block or memory cell of a first die 614 is operated upon, as is a first block of a second die 616. That is, the first block of the first die 614 is operated on substantially in parallel with the first block of the second die 616. Once the operations on the first block of the first die 614 and the first block of the second die 616 are completed, then at a time t2 606, parallel operations may be performed on a second block of the first die 618 and a second block of the second die 620. Similarly, at a time t3 610, parallel operations may be performed on a third block of the first die 622 and a third block of the second die 624.

As mentioned above, operations such as write operations and erase operations may occur in parallel to reduce the amount of time typically required for such operations by up to approximately fifty percent. Therefore, the time associated overall testing processes, e.g., testing processes performed on memory devices or packages to determine if the memory devices or packages are useable, may be relatively significantly reduced.

Figure 7:
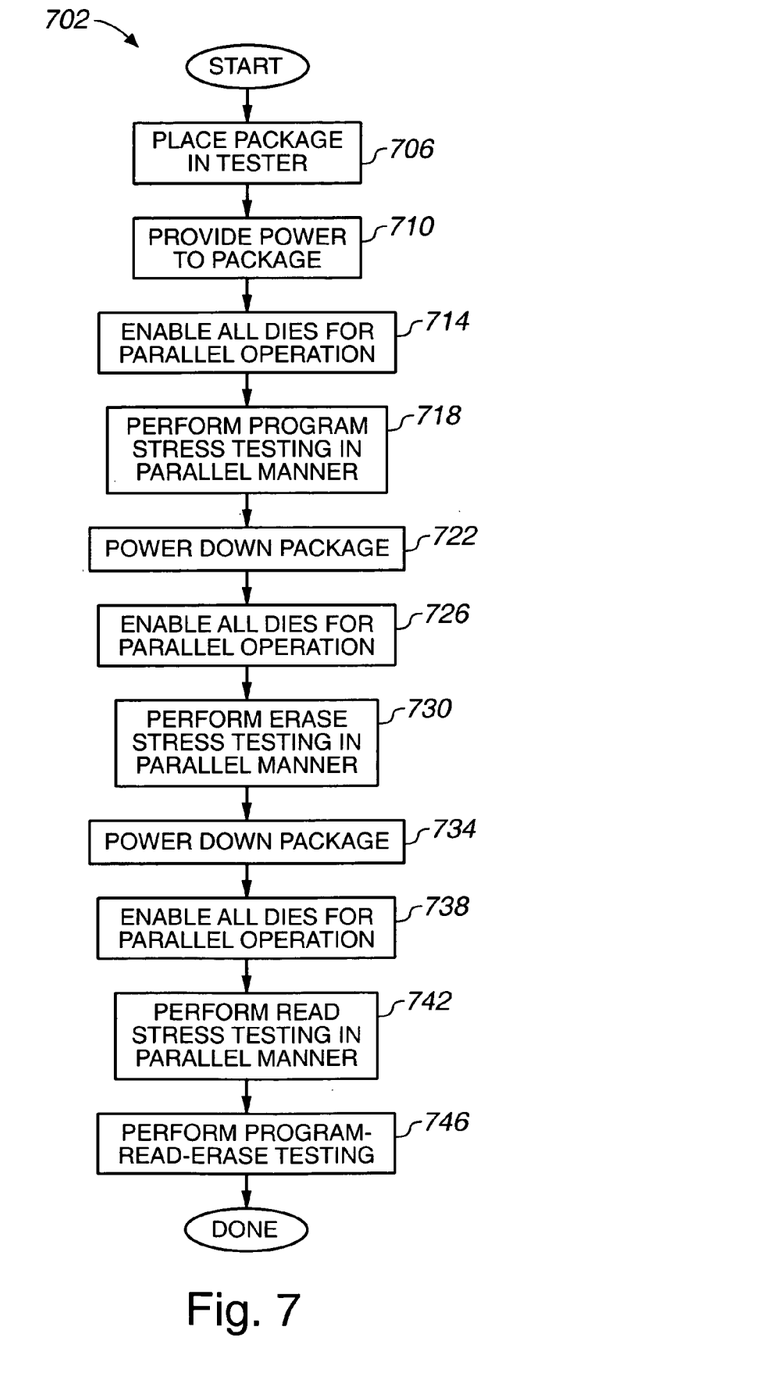
FIG. 7 is a process flow diagram which illustrates the steps associated with method of testing a flash memory package with a plurality of dies which are access a parallel manner in accordance with an embodiment of the present invention.

FIG. 7 is a process flow diagram which illustrates the steps associated with a method of testing a flash memory package with a plurality of dies in accordance with an embodiment of the present invention. A process 702 begins at step 706 in which a flash memory package is placed in a tester which may include, for example, a support element, test heads, and a computing system. Tester is generally configured to supply enough current to enable signals to reach each die in the plurality of dies concurrently. Typically, substantially any tester may be used to test a flash memory package. In the described embodiment, the package is configured to include two dies or chips that may be enabled at the same time. It should be appreciated, however, that the number of dies which may be enabled at the same time may vary widely depending upon the requirements of the package. Once the package is placed in the tester, power is provided to the package in step 710.

In general, a tester that tests a package is arranged to perform testing on more than one package at any given time. For example, one suitable tester or testing device may include two heads that each test thirty two packages at a time. However, for purposes of discussion, process 702 is described in terms of testing a single package that includes a plurality of dies which may be enabled in parallel.

After the package is powered up, the dies in the package are enabled for parallel operation in step 714. Enabling the dies for parallel operation may include issuing commands from the tester which configure the dies to accept simultaneous commands, i.e., which configure the dies such that a first die and a second die receive commands substantially simultaneously. Upon enabling the dies in parallel, program stress testing is performed in a parallel manner in step 718. Performing program stress testing in a parallel manner may include testing a first memory cell or block in the first die substantially simultaneously with a first memory cell or block in the second die, then testing subsequent memory cells in each die substantially simultaneously. By performing program stress testing in a parallel manner, the time associated with performing a program stress test may be reduced by approximately fifty percent, as both dies in the package are tested in a substantially simultaneous manner. It should be appreciated that, in general, program stress testing may include performing status reads to ascertain, in part, whether charge is held properly in the memory cells of the plurality of dies.

Once program stress testing is completed, the package is powered down in step 722. Then, all dies are enabled for parallel operation in step 726, and erase stress testing is performed in a parallel manner in step 730. Performing erase stress testing in a parallel manner, rather than in a serial manner, enables the amount of time that is consumed by an erase stress test to be reduced by approximately fifty percent. The package is powered down in step 734 after the erase stress testing is completed, and the dies are once again enabled for parallel operation in step 738. Read stress testing is then performed in a parallel manner since the output data are typically insignificant in a stress test, which is typically more efficient than performing read stress in a serial manner. When the read stress testing is completed, substantially all stress testing is effectively considered to be completed, and program-read-erase testing may occur. As such, process flow proceeds to step 746 in which program-read-erase testing is performed. The steps associated with one suitable method of performing program-read-erase testing will be described below with respect to FIG. 8. After program-read-erase testing is completed, the process of testing a flash memory package which includes a plurality of dies is effectively completed.

Figure 8:
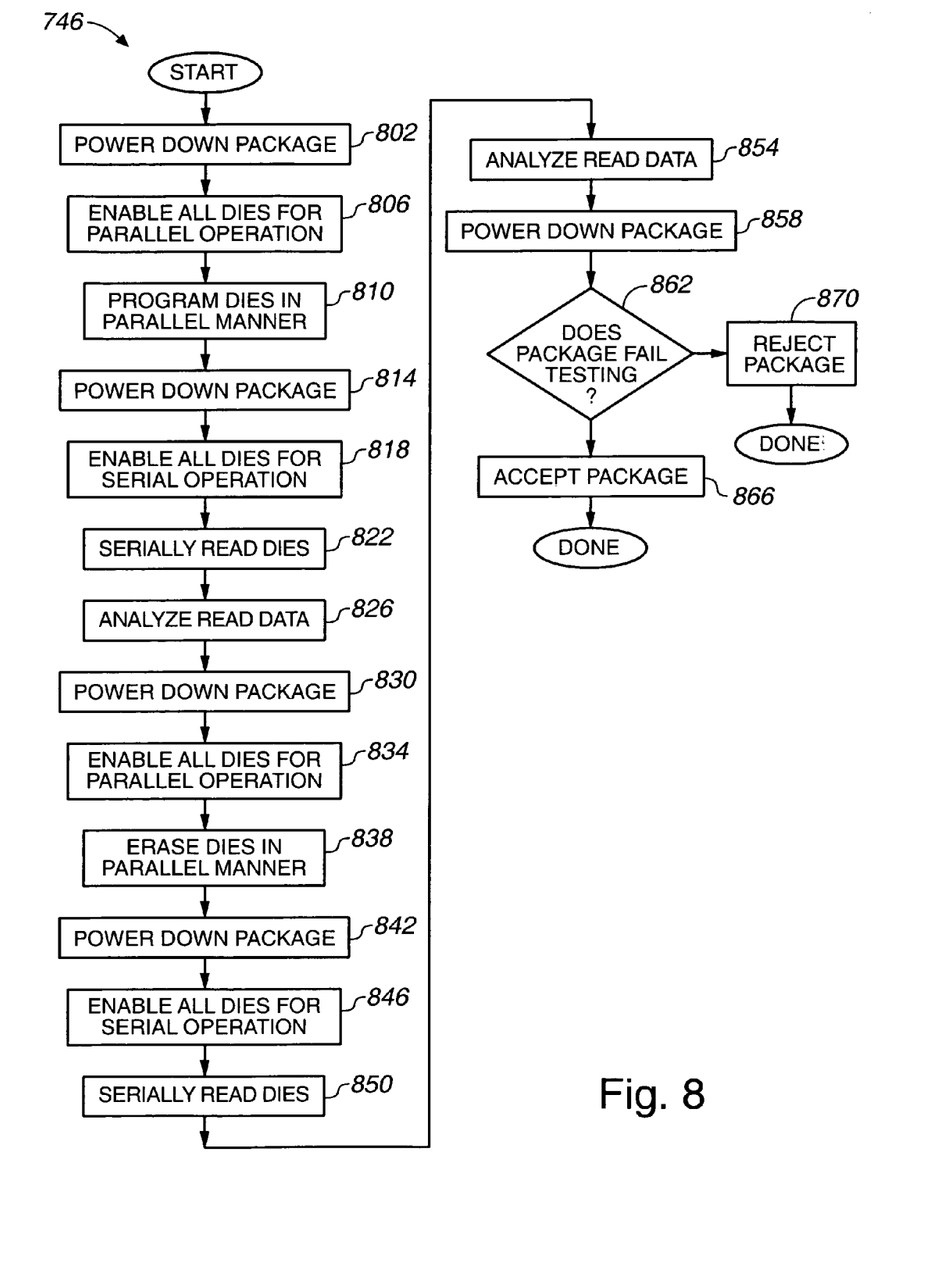
FIG. 8 is a process flow diagram which illustrates the steps associated with a performing a program-read-erase test, i.e., step 746 of FIG. 7, on a flash memory package with a plurality of dies which are accessible in a parallel manner in accordance with an embodiment of the present invention.

Referring next to FIG. 8, the steps associated with one method of performing a program-read-erase test, e.g., step 746 of FIG. 7, on a flash memory package with a plurality of dies will be described in accordance with an embodiment of the present invention. A process 746 begins at step 802 in which the package is powered down. Once the package is powered down, the dies in the package are enabled for parallel operation in step 806. Enabling the dies in the package for parallel operation generally includes issuing a command or an instruction from the tester to the package to prepare the dies to be tested in parallel, as previously mentioned.

After the dies are enabled for parallel operation, the dies are programmed in parallel in step 810. That is, the plurality of dies in the package are programmed such that memory cells in each die are programmed such that one memory cell in each die is programmed at substantially the same time in response to a program command or a program instruction. When the programming is completed, the package is powered down in step 814, and the plurality of dies in the package are enabled for serial operation in step 818. Enabling the plurality of dies for serial operation may entail issuing a command from the tester to prepare the dies to be tested sequentially, i.e., tested such that the second die is substantially only tested after the first die has been tested.

Once the dies are enabled for serial operation, the dies are read serially in step 822. In other words, the contents of the dies or, more specifically, the contents of the memory cells associated with the dies, are read serially. The read data is then analyzed in step 826 to determine whether the read data is expected. That is, the analysis in step 826 may be performed to ascertain whether the data that was programmed in step 810 is consistent with what is expected and, hence, if there may have been a problem either with programming the dies or reading the dies.

Upon analyzing the read data in step 826, the package is powered down in step 830. Then, in step 834, the plurality of dies are enabled for parallel operation. After the plurality of dies are enabled for parallel operation, the plurality of dies are erased in a parallel manner in step 838, and the package is the powered down in step 842. Process flow then proceeds to step 846 in which the plurality of dies is enabled for serial operation. The contents of the dies are read serially in step 850 such that the memory cells of one die within the package are read serially before the memory cells of the other die within the package are read serially. The data that is read from the memory cells is analyzed in step 854, essentially to ascertain whether the memory cells were properly erased in step 838 or if the read process is successful.

From step 854, process flow moves to step 858 in which the package is powered down. Once the package is powered down, it is determined in step 862 if the package failed the program-read-erase test. If it is determined that the package failed testing, then the indication is than an unacceptable number of memory cells associated with the package either failed to be programmed properly, failed to be read properly, or failed to be erased properly. As a result, the package is rejected in step 870, and the process of performing a program-read-erase test is completed. Alternatively, if it is determined in step 862 that the package did not fail testing, then the package is accepted in step 866, and the process of performing a program-read-erase test is completed.

As mentioned above, allowing program and erase operations associated with testing, e.g., diagnostic testing, that is performed in parallel such that multiple dies associated with a memory device or package may be substantially simultaneously tested reduces the time associated with the overall testing of a memory device. In other words, allowing program and erase testing to occur in parallel with respect to multiple dies on a memory device increases the efficiency with which overall testing of the memory device may be performed. For instance, in addition to test processes being time consuming, test systems which are arranged to test memory devices are typically expensive, and have limited capacity, e.g., a two-headed test system may test a total of approximately sixty-four memory devices at a time. Hence, significantly reducing the amount of time associated with an overall test process may result in a substantial increase in the throughput associated with test systems.

Figure 9:
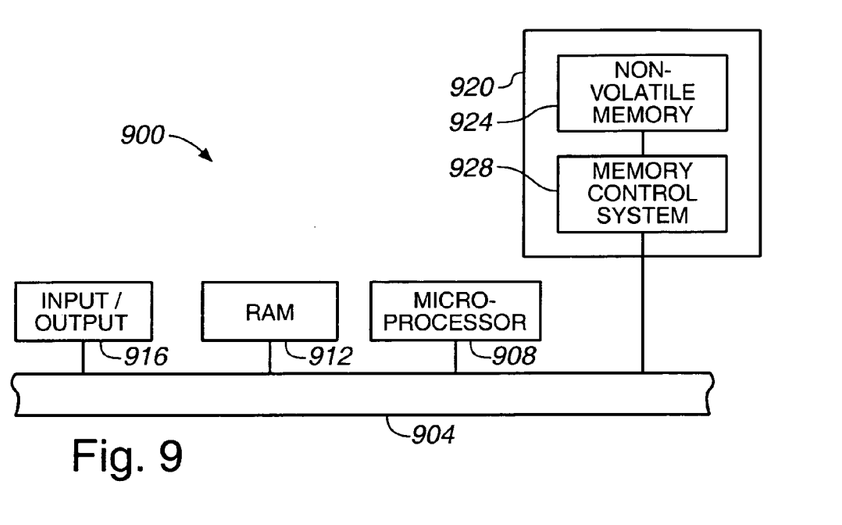
FIG. 9 is a diagrammatic representation of a general host system which includes a non-volatile memory device in accordance with an embodiment of the present invention.

Memory devices or packages are generally arranged to be used by a host system to store data. For example, when data is to be stored on a memory or storage device such as a non-volatile memory device, a host system may provide the data to the non-volatile memory device. Within the non-volatile memory device, the data may be stored in memory cells that are divided into sectors or blocks. With reference to FIG. 9, a general host system which includes a non-volatile memory device, e.g., a CompactFlash memory card, will be described. A host or computer system 900 generally includes a system bus 904 which allows a microprocessor 908, a random access memory (RAM) 912, and input/output circuits 916 to communicate. It should be appreciated that host system 900 may generally include other components, e.g., display devices and networking device, which are not shown for purposes of illustration.

In general, host system 900 may be capable of capturing information including, but not limited to, still image information, audio information, and video image information. Such information may be captured in real-time, and may be transmitted to host system 900 in a wireless manner. While host system 900 may be substantially any system, host system 900 is typically a system such as a digital camera, a video camera, a cellular communications device, an audio player, or a video player. It should be appreciated, however, that host system 900 may generally be substantially any system which stores data or information. In one embodiment, host system 900 may be a tester which is arranged to test the functionality of a non-volatile memory device 920. That is, host system 900 may be a tester which is arranged to perform stress tests and program-read-erase tests on non-volatile memory device 920.

Non-volatile memory device 920 which, in one embodiment, is a removable non-volatile memory device, is arranged to interface with bus 904 to store information. For example, bus 904 may serve as a signal source which provides a data signal that is received by non-volatile memory device 920 on a pad such as pad 508 of FIG. 5. Non-volatile memory device 920 includes non-volatile memory 924 and a memory control system 928 which may include or be in communication with a state machine, e.g., state machine 514 of FIG. 5. In one embodiment, non-volatile memory device 920 may be implemented on a single chip or a die. Alternatively, non-volatile memory device 920 may be implemented on a multi-chip module.

Non-volatile memory device 920 has generally been described as including a memory control system 928, i.e., a controller. Often, non-volatile memory device 920 may include separate chips for non-volatile memory 124 and memory control system 928, i.e., controller, functions. By way of example, while non-volatile memory devices including, but not limited to, PC cards, CompactFlash cards, MultiMedia cards, and secure digital cards include controllers which may be implemented on a separate chip, other non-volatile memory devices may not include controllers that are implemented on a separate chip. In an embodiment in which non-volatile memory device 920 does not include separate memory and controller chips, the memory and controller functions may be integrated into a single chip, as will be appreciated by those skilled in the art.

In general, one non-volatile memory device 924 which includes a plurality of dies may be a thin small outline package (TSOP). In one embodiment, all dies inside a TSOP may be selected using a multi-chip select command, as for example a multi-chip select command issued by a testing device to a state machine associated with the TSOP. The multi-chip command may cause a most significant address bit which differentiates the dies to be configured such that all dies are selected. As a result of the multi-chip command, all dies may concurrently receive the same command, address, and data for program and erase operations during testing. Hence, the dies are substantially all programmed and erased substantially simultaneously.

Once the dies are programmed or erased, a multi-chip deselect command may be provided by the testing device to the state machine to cause the most significant address bit which differentiates the dies to select specific dies. Such a command may be issued without resetting a status register associated with each die. Then, commands may be issued to read the contents of memory cells in a serial manner, or sequentially, one die at a time, to screen for defects associated with the TSOP. In general, the test time associated with testing the TSOP is reduced, as when all dies are programmed or erased substantially simultaneously instead of sequentially, the time associated with programming or erasing all dies is effectively masked into the time associated with programming or erasing a first die.

Figure 10:
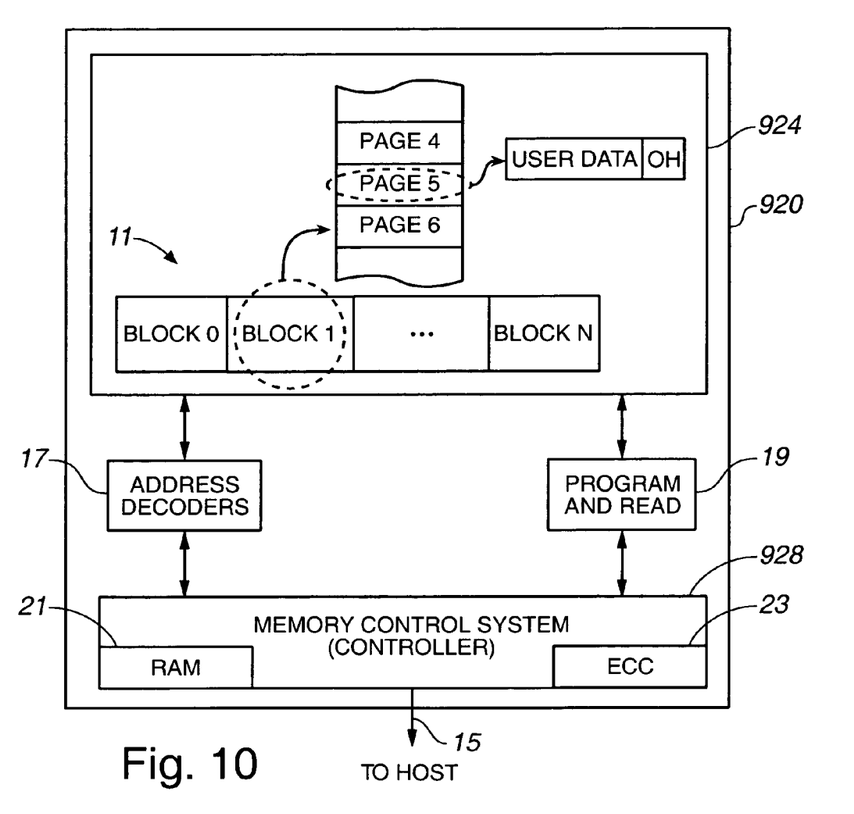
FIG. 10 is a diagrammatic representation of a non-volatile memory device, e.g., non-volatile memory device 920 of FIG. 9, in accordance with an embodiment of the present invention.

With reference to FIG. 10, non-volatile memory device 920 will be described in more detail in accordance with an embodiment of the present invention. As described above, non-volatile memory device 920 includes non-volatile memory 924 and memory control system 928. Memory 924 and control system 928, or controller, are primary components of non-volatile memory device 920. Memory 924 may be an array of memory cells formed on a semiconductor substrate, wherein one or more bits of data are stored in the individual memory cells by storing one of two or more levels of charge on individual storage elements of the memory cells. A non-volatile flash electrically erasable programmable read only memory (EEPROM) is an example of a common type of memory for such systems.

Control system 928 communicates over a bus 15 to a host computer or other system that is using the memory system to store data. Bus 15 is generally a part of bus 904 of FIG. 9. Control system 928 also controls operation of memory 924, which may include a memory cell array 11, to write data provided by the host, read data requested by the host and perform various housekeeping functions in operating memory 924. Control system 928 generally includes a general purpose microprocessor which has associated non-volatile software memory, various logic circuits, and the like. One or more state machines are often also included for controlling the performance of specific routines.

Memory cell array 11 is typically addressed by control system 928 through address decoders 17. Decoders 17 apply the correct voltages to gate and bit lines of array 11 in order to program data to, read data from, or erase a group of memory cells being addressed by the control system 928. Additional circuits 19 include programming drivers that control voltages applied to elements of the array that depend upon the data being programmed into an addressed group of cells. Circuits 19 also include sense amplifiers and other circuits necessary to read data from an addressed group of memory cells. Data to be programmed into array 11, or data recently read from array 11, are typically stored in a buffer memory 21 within control system 928. Control system 928 also usually contains various registers for temporarily storing command and status data, and the like.

Although only a few embodiments of the present invention have been described, it should be understood that the present invention may be embodied in many other specific forms without departing from the spirit or the scope of the present invention. By way of example, memory packages have generally been described as including two dies or modules which may be accessed in parallel. It should be appreciated, however, that memory packages may have any number of dies, e.g., more than two dies. That is, memory packages may be multi-module packages with any number of dies. Within memory packages which include more than two dies, dies may be enabled in parallel such that memory cells on all dies are programmed and erased at substantially the same time. Alternatively, when a memory package includes more than two dies, dies may be enabled in parallel such that memory cells on a subset of the dies are programmed and erased at substantially the same time while other dies are not programmed and erased in parallel with the subset of dies.

A memory package which includes dies or modules that may be enabled in parallel has been described as being a non-volatile memory package such as a flash memory package. In general, however, dies or modules that may be enabled in parallel may be included in substantially any suitable memory device with a program or write time that is relatively long, or an erase time that is relatively long. Such memory devices include, but are not limited to, dynamic random access memories (DRAMs).

Further, the present invention may generally be implemented with respect to the design and the testing of substantially any suitable memory device. Suitable memory devices, as described above, may include, PC cards, CompactFlash cards, MultiMedia cards, and secure digital cards. Other suitable memory devices may include, but are not limited to, Smart Media cards and Memory Stick cards.

While enabling dies or modules of a memory package in parallel has been described as being suitable for programming the dies in parallel and erasing the dies in parallel during testing, it should be appreciated that in some embodiments, parallel testing procedures may be substantially combined. For instance, for an embodiment in which erasing dies in series is desirable, the dies may be erased in series but programmed in parallel. Alternatively, for an embodiment in which programming dies in series is desirable, the dies may be programmed in series and erased in parallel. Performing either a parallel program process or a parallel erase process generally still results in a relatively significant reduction of time associated with a testing process when compared to a conventional testing process.

In addition to improving testing processes performed on memory packages with a plurality of dies, enabling dies for parallel operation may also enhance memory and system level performance associated with the memory packages. For example, unique user data may be loaded into the data cache of each individual die or module, then broadcasted to substantially all intended modules substantially simultaneously, thereby reducing the amount of time generally required to complete a program or write process. A multi-chip select command may be issued to allow the data or command to be broadcast substantially simultaneously. Erase performance may also be improved due to parallel program and erase functionality by allowing different blocks associated with different dies to be erased as a result of a single erase command. That is, a single erase command may enable blocks associated with a plurality of dies to be erased concurrently while the memory package on which the plurality of dies is located is in use. In general, the performance of overall parallel program and erase operations may be further increased by increasing the number of modules in a memory package which may be accessed in parallel.

The parallel testing of dies in a memory package has generally been described as being associated with transmitting a signal across a single line, e.g. through a single pad in the memory package, to each die substantially concurrently. It should be appreciated, however, that the parallel testing of dies may also be performed using more than one line or pad associated with a memory package. By way of example, a signal may be provided by a host system such as a tester to two pads concurrently such that one pad provides the signal to one die while the second pad provides the signal to another die substantially simultaneously. In other words, parallel access to a plurality of dies may be achieved by sending the same signal through separate pads to the plurality of dies substantially simultaneously.

The steps associated with testing a memory package which has parallel testing functionality may be widely varied. Steps may be added, removed, altered, and reordered without departing from the spirit or the scope of the present invention. By way of example, status-read operations and similar operations may generally be automatically performed while a test is being performed for internal verification purposes. Therefore, the present examples are to be considered as illustrative and not restrictive, and the invention is not to be limited to the details given herein, but may be modified within the scope of the appended claims.

What is claimed is:

1. A memory device for storing data, the memory device comprising:
   a plurality of modules, the plurality of modules each including a plurality of storage elements, wherein the plurality of storage elements are arranged to hold the data;
   a logic block, the logic block being arranged to enable a first subset of the plurality of modules to be accessed in parallel, the logic block further being arranged to enable the first subset of the plurality of modules to be accessed serially, wherein the first subset of the plurality of modules includes a first module and a second module, the first module including a first storage element, the second module including a second storage element, the first storage element and the second storage element being included in the plurality of storage elements; and
   a signal source, the signal source being arranged to provide a signal including the data to at least one of the first storage element and the second storage element, wherein when the logic block enables the first subset of the plurality of modules to be accessed in parallel, the signal source provides the signal to the first storage element and the second storage element substantially concurrently and the signal source is in communication with a testing device to receive the signal from the testing device, the testing device having one or more test heads and a computing device.

2. The memory device of claim 1 wherein when the logic block enables the first subset of the plurality of modules to be accessed serially, the signal source provides the signal to the first module and the second module serially such that the signal source provides the signal to the first storage element before the signal source provides the signal to the second storage element.

3. The memory device of claim 1 wherein the logic block is arranged to enable the first storage element and the second storage element to be programmed substantially concurrently.

4. The memory device of claim 1 wherein the logic block is arranged to enable the first storage element and the second storage element to be erased substantially concurrently.

5. The memory device of claim 1 wherein the memory device is a non-volatile memory device, and the plurality of storage elements are non-volatile storage elements.

6. The memory device of claim 5 wherein the memory device is one of a CompactFlash card, a MultiMedia card, a Secure Digital card, a Memory Stick card, and a SmartMedia card.

7. A computing system comprising:
   a host system, the host system including a testing system that has one or more test heads, the testing system being arranged to test the functionality of a memory card;
   a memory system in the memory card, the memory system being in communication with the host system, the memory system including a plurality of modules, the plurality of modules each including a non-volatile memory array that is arranged to hold data, the memory system further including a state machine, the state machine being arranged to enable a first subset of the plurality of modules to be accessed in parallel, the state machine further being arranged to enable the first subset of the plurality of modules to be accessed serially; and
   wherein the memory card is one selected from the group consisting of a CompactFlash card, a MultiMedia card, a Secure Digital card, a Memory Stick, and a SmartMedia card.

8. The computing system of claim 7 wherein the first subset of the plurality of modules includes a first module and a second module, the first module including a first non-volatile memory array, the second module including a second non-volatile memory array.

9. The computing system of claim 8 wherein the host system includes a signal source and the memory system includes a signal receiver, the signal source being arranged to provide a data signal to the signal receiver.

10. The computing system of claim 9 wherein the signal receiver is arranged to provide the data signal to the first non-volatile memory array and the second non-volatile memory array substantially concurrently when the first subset of the plurality of modules is enabled to be accessed in parallel.

11. The computing system of claim 10 wherein the memory system is a memory card, the memory card being removably coupled from the host system, and the non-volatile memory array included in each of the modules of the first subset of the plurality of modules is on a separate die.

12. The computing system of claim 7 wherein the host system is arranged to capture information and to attempt to store the information in the memory system.

13. The computing system of claim 12 wherein the information is one of still image information, audio information, video image information, and wireless information.

14. The computing system of claim 13 wherein the host system is one of a digital camera, a video camera, a cellular communications device an audio player, and a video player.

15. A method for testing a memory system, the memory system including at least a first module, a second module, and a third module, the method comprising:
   enabling the first module and the second module but not the third module to be tested in parallel, wherein enabling the first module and the second module but not the third module to be tested in parallel includes configuring the first module and the second module but not the third module to process an instruction substantially concurrently, wherein the first module includes a first storage element, the second module includes a second storage element, and the third module includes a third storage element, and wherein the instruction is a program instruction and causing the first module and the second module but not the third module to process the instruction substantially concurrently includes causing the first storage element and the second storage element but not the third storage element to be programmed substantially concurrently;

issuing the instruction to the first module and the second module;

causing the first module and the second module but not the third module to process the instruction substantially concurrently;

enabling the first module and the second module to be tested in series after causing the first module and the second module to process the instruction substantially concurrently, wherein enabling the first module and the second module to be tested in series includes configuring the first module to process a read instruction before the second module processes the read instruction;

issuing the read instruction to the first module and the second module;

reading contents of the first storage element; and reading contents of the second storage element after reading the contents of the first storage element.

16. The method of claim 15 further including:

issuing an erase instruction to the first module and the second module, wherein the erase instruction that causes the first storage element and the second storage element to be erased substantially concurrently.

17. The method of claim 16 further including:

determining when at least one of the program instruction, the read instruction, and the erase instruction is unsuccessful, wherein determining when at least one of the program instruction, the read instruction, and the erase instruction is unsuccessful includes analyzing the read contents of the first storage element and analyzing the read contents of the second storage element.

18. The method of claim 15 wherein the first module includes a first storage element, the second module includes a second storage element, and the third module includes a third storage element, and wherein the instruction is an erase instruction, and causing the first module and the second module but not the third module to process the instruction substantially concurrently includes causing the first storage element and the second storage element but not the third storage element to be erased substantially concurrently.

19. The method of claim 15 further including performing at least one stress test on the first module and the second module.

20. The method of claim 15 wherein the memory system is a flash memory card, and the first module is a first die associated with the flash memory card and the second module is a second die associated with the flash memory card.

21. A method for testing a memory system, the memory system including at least a first module and a second module, the method comprising:

enabling the first module and the second module to be tested, wherein enabling the first module and the second module to be tested includes configuring the first module and the second module to process a first instruction substantially in parallel and to process a second instruction substantially in series;

issuing the first instruction to the first module and the second module;

causing the first module and the second module to process the first instruction substantially in parallel;

issuing the second instruction to the first module and the second module; and causing the first module and the second module to process the second instruction substantially in series.

22. The method of claim 21 wherein the first instruction is a programming instruction and the second instruction is a read instruction.

23. The method of claim 21 wherein the first instruction is an erase instruction and the second instruction is a read instruction.

* * * * *